(12) United States Patent
Perera et al.

(10) Patent No.: US 8,877,585 B1
(45) Date of Patent: Nov. 4, 2014

(54) NON-VOLATILE MEMORY (NVM) CELL, HIGH VOLTAGE TRANSISTOR, AND HIGH-K AND METAL GATE TRANSISTOR INTEGRATION

(71) Applicants: Asanga H. Perera, West Lake Hills, TX (US); Cheong Min Hong, Austin, TX (US); Sung-Taeg Kang, Austin, TX (US)

(72) Inventors: Asanga H. Perera, West Lake Hills, TX (US); Cheong Min Hong, Austin, TX (US); Sung-Taeg Kang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/969,180

(22) Filed: Aug. 16, 2013

(51) Int. Cl.
*H01L 21/336* (2006.01)

(52) U.S. Cl.
CPC .............................. *H01L 21/28278* (2013.01)
USPC ............ 438/258; 257/E21.422; 257/E21.684; 257/E21.685; 257/E21.686; 257/E21.687; 257/E21.688; 257/E21.689; 438/257; 438/283; 438/288

(58) Field of Classification Search
USPC ................... 257/E21.422, E21.684, E21.685, 257/E21.686, E21.687, E21.688, E21.689; 438/257, 258, 283, 288
See application file for complete search history.

(56) References Cited

U.S. PATENT DOCUMENTS

| | | | |
|---|---|---|---|
| 5,614,746 A | 3/1997 | Hong et al. | |
| 6,087,225 A | 7/2000 | Bronner et al. | |
| 6,194,301 B1 | 2/2001 | Radens et al. | |
| 6,235,574 B1 | 5/2001 | Tobben et al. | |
| 6,333,223 B1 | 12/2001 | Moriwaki et al. | |
| 6,388,294 B1 | 5/2002 | Radens et al. | |
| 6,509,225 B2 | 1/2003 | Moriwaki et al. | |
| 6,531,734 B1 | 3/2003 | Wu | |
| 6,635,526 B1 | 10/2003 | Malik et al. | |
| 6,707,079 B2 | 3/2004 | Satoh et al. | |
| 6,777,761 B2 | 8/2004 | Clevenger et al. | |
| 6,785,165 B2 * | 8/2004 | Kawahara et al. | 365/185.28 |
| 6,939,767 B2 | 9/2005 | Hoefler et al. | |
| 7,154,779 B2 | 12/2006 | Mokhlesi et al. | |

(Continued)

FOREIGN PATENT DOCUMENTS

WO  2009058486  5/2009

OTHER PUBLICATIONS

U.S. Appl. No. 13/781,727, Office Action—Allowance, May 12, 2014.

(Continued)

*Primary Examiner* — Asok K Sarkar
(74) *Attorney, Agent, or Firm* — James L. Clingan, Jr.; Mary Jo Bertani

(57) ABSTRACT

A method of making a semiconductor structure using a substrate having a non-volatile memory (NVM) portion, a first high voltage portion, a second high voltage portion and a logic portion, includes forming a first conductive layer over an oxide layer on a major surface of the substrate in the NVM portion, the first and second high voltage portions, and logic portion. A memory cell is fabricated in the NVM portion while the first conductive layer remains in the first and second high voltage portions and the logic portion. The first conductive layer is patterned to form transistor gates in the first and second high voltage portions. A protective mask is formed over the NVM portion and the first and second high voltage portions. A transistor gate is formed in the logic portion while the protective mask remains in the NVM portion and the first and second high voltage portions.

20 Claims, 14 Drawing Sheets

(56) References Cited

U.S. PATENT DOCUMENTS

| | | | |
|---|---|---|---|
| 7,183,159 B2* | 2/2007 | Rao et al. ............... | 438/258 |
| 7,190,022 B2* | 3/2007 | Shum et al. ............. | 257/316 |
| 7,202,524 B2 | 4/2007 | Kim et al. | |
| 7,208,793 B2 | 4/2007 | Bhattacharyya | |
| 7,256,125 B2* | 8/2007 | Yamada et al. .......... | 438/683 |
| 7,271,050 B2 | 9/2007 | Hill | |
| 7,365,389 B1 | 4/2008 | Jeon et al. | |
| 7,391,075 B2 | 6/2008 | Jeon et al. | |
| 7,402,493 B2 | 7/2008 | Oh et al. | |
| 7,405,968 B2 | 7/2008 | Mokhlesi et al. | |
| 7,439,134 B1 | 10/2008 | Prinz et al. | |
| 7,476,582 B2 | 1/2009 | Nakagawa et al. | |
| 7,521,314 B2 | 4/2009 | Jawarani et al. | |
| 7,524,719 B2 | 4/2009 | Steimle et al. | |
| 7,544,490 B2 | 6/2009 | Ferrari et al. | |
| 7,544,980 B2 | 6/2009 | Chindalore et al. | |
| 7,544,990 B2 | 6/2009 | Bhattacharyya | |
| 7,560,767 B2 | 7/2009 | Yasuda et al. | |
| 7,795,091 B2 | 9/2010 | Winstead et al. | |
| 7,799,650 B2 | 9/2010 | Bo et al. | |
| 7,816,727 B2 | 10/2010 | Lai et al. | |
| 7,821,055 B2 | 10/2010 | Loiko et al. | |
| 7,906,396 B1 | 3/2011 | Chiang et al. | |
| 7,932,146 B2 | 4/2011 | Chen et al. | |
| 7,989,871 B2 | 8/2011 | Yasuda | |
| 7,999,304 B2 | 8/2011 | Ozawa et al. | |
| 8,017,991 B2 | 9/2011 | Kim et al. | |
| 8,043,951 B2* | 10/2011 | Beugin et al. ........... | 438/593 |
| 8,063,434 B1 | 11/2011 | Polishchuk et al. | |
| 8,093,128 B2* | 1/2012 | Koutny et al. ........... | 438/288 |
| 8,138,037 B2 | 3/2012 | Chudzik et al. | |
| 8,168,493 B2 | 5/2012 | Kim | |
| 8,298,885 B2 | 10/2012 | Wei et al. | |
| 8,334,198 B2 | 12/2012 | Chen et al. | |
| 8,372,699 B2 | 2/2013 | Kang et al. | |
| 8,389,365 B2 | 3/2013 | Shroff et al. | |
| 8,399,310 B2 | 3/2013 | Shroff et al. | |
| 8,524,557 B1 | 9/2013 | Hall et al. | |
| 8,536,006 B2 | 9/2013 | Shroff et al. | |
| 8,536,007 B2 | 9/2013 | Shroff et al. | |
| 8,679,927 B2* | 3/2014 | Ramkumar et al. ..... | 438/288 |
| 2001/0049166 A1* | 12/2001 | Peschiaroli et al. ..... | 438/202 |
| 2002/0061616 A1 | 5/2002 | Kim et al. | |
| 2003/0022434 A1* | 1/2003 | Taniguchi et al. ....... | 438/240 |
| 2004/0075133 A1 | 4/2004 | Nakagawa et al. | |
| 2004/0262670 A1* | 12/2004 | Takebuchi et al. ...... | 257/315 |
| 2005/0145949 A1* | 7/2005 | Sadra et al. ............. | 257/368 |
| 2006/0038240 A1* | 2/2006 | Tsutsumi et al. ........ | 257/392 |
| 2006/0046449 A1 | 3/2006 | Liaw | |
| 2006/0099798 A1* | 5/2006 | Nakagawa ............... | 438/622 |
| 2006/0134864 A1* | 6/2006 | Higashitani et al. ..... | 438/257 |
| 2006/0211206 A1* | 9/2006 | Rao et al. ................ | 438/275 |
| 2006/0221688 A1* | 10/2006 | Shukuri et al. .......... | 365/185.05 |
| 2007/0037343 A1 | 2/2007 | Colombo et al. | |
| 2007/0077705 A1 | 4/2007 | Prinz et al. | |
| 2007/0115725 A1* | 5/2007 | Pham et al. ............. | 365/185.18 |
| 2007/0215917 A1 | 9/2007 | Taniguchi | |
| 2007/0224772 A1 | 9/2007 | Hall et al. | |
| 2007/0249129 A1 | 10/2007 | Hall et al. | |
| 2007/0264776 A1 | 11/2007 | Dong et al. | |
| 2008/0029805 A1 | 2/2008 | Shimamoto et al. | |
| 2008/0050875 A1 | 2/2008 | Moon et al. | |
| 2008/0067599 A1* | 3/2008 | Tsutsumi et al. ........ | 257/358 |
| 2008/0105945 A1* | 5/2008 | Steimle et al. .......... | 257/500 |
| 2008/0121983 A1 | 5/2008 | Seong et al. | |
| 2008/0128785 A1* | 6/2008 | Park et al. ............... | 257/321 |
| 2008/0145985 A1 | 6/2008 | Chi | |
| 2008/0185635 A1 | 8/2008 | Yanagi et al. | |
| 2008/0237690 A1* | 10/2008 | Anezaki et al. ......... | 257/316 |
| 2008/0237700 A1 | 10/2008 | Kim et al. | |
| 2008/0283900 A1* | 11/2008 | Nakagawa et al. ...... | 257/321 |
| 2008/0290385 A1 | 11/2008 | Urushido | |
| 2008/0308876 A1 | 12/2008 | Lee et al. | |
| 2009/0050955 A1 | 2/2009 | Akita et al. | |
| 2009/0065845 A1 | 3/2009 | Kim et al. | |
| 2009/0072274 A1 | 3/2009 | Knoefler et al. | |
| 2009/0078986 A1 | 3/2009 | Bach | |
| 2009/0101961 A1 | 4/2009 | He et al. | |
| 2009/0111229 A1 | 4/2009 | Steimle et al. | |
| 2009/0179283 A1 | 7/2009 | Adams et al. | |
| 2009/0225602 A1 | 9/2009 | Sandhu et al. | |
| 2009/0256211 A1 | 10/2009 | Booth, Jr. et al. | |
| 2009/0269893 A1* | 10/2009 | Hashimoto et al. ...... | 438/264 |
| 2009/0273013 A1 | 11/2009 | Winstead et al. | |
| 2009/0278187 A1 | 11/2009 | Toba | |
| 2011/0031548 A1 | 2/2011 | White et al. | |
| 2011/0095348 A1 | 4/2011 | Chakihara et al. | |
| 2011/0204450 A1 | 8/2011 | Moriya | |
| 2011/0260258 A1 | 10/2011 | Zhu et al. | |
| 2012/0034751 A1* | 2/2012 | Ariyoshi et al. ......... | 438/381 |
| 2012/0104483 A1 | 5/2012 | Shroff et al. | |
| 2012/0132978 A1 | 5/2012 | Toba et al. | |
| 2012/0142153 A1 | 6/2012 | Jeong | |
| 2012/0248523 A1 | 10/2012 | Shroff et al. | |
| 2012/0252171 A1 | 10/2012 | Shroff et al. | |
| 2013/0026553 A1 | 1/2013 | Horch | |
| 2013/0037886 A1 | 2/2013 | Tsai et al. | |
| 2013/0065366 A1 | 3/2013 | Thomas et al. | |
| 2013/0084684 A1* | 4/2013 | Ishii et al. ............... | 438/257 |
| 2013/0137227 A1 | 5/2013 | Shroff et al. | |
| 2013/0171785 A1 | 7/2013 | Shroff et al. | |
| 2013/0171786 A1 | 7/2013 | Shroff et al. | |
| 2013/0178027 A1 | 7/2013 | HALL et al. | |
| 2013/0178054 A1 | 7/2013 | Shroff et al. | |
| 2013/0264633 A1 | 10/2013 | HALL et al. | |
| 2013/0264634 A1 | 10/2013 | HALL et al. | |
| 2013/0267074 A1 | 10/2013 | HALL et al. | |
| 2013/0323922 A1 | 12/2013 | Shen et al. | |
| 2014/0035027 A1 | 2/2014 | Chakihara et al. | |
| 2014/0050029 A1 | 2/2014 | Kang et al. | |
| 2014/0120713 A1 | 5/2014 | Shroff et al. | |

OTHER PUBLICATIONS

U.S. Appl. No. 13/441,426, Shroff, M. D., et al., Office Action—Allowance, mailed Jun. 9, 2014.

U.S. Appl. No. 13/907,491, Office Action—Rejection, Sep. 3, 2013.

U.S. Appl. No. 13/343,331, Office Action—Allowance, Nov. 8, 2013.

U.S. Appl. No. 13/781,727, Office Action—Restriction, Jun. 21, 2013.

Chen, J.H., et al., "Nonvolatile Flash Memory Device Using Ge Nanocrystals Embedded in HfA10 High-k Tunneling and Control Oxides: Device Fabrication and Electrical Performance", IEEE Transactions on Electron Devices, vol. 51, No. 11, Nov. 2004, pp. 1840-1848.

Kang, T.K., et al., "Improved characteristics for Pd nanocrystal memory with stacked HfAIO-SiO2 tunnel layer", Sciencedirect. com, Solid-State Electronics, vol. 61, Issue 1, Jul. 2011, pp. 100-105, http://wwww.sciencedirect.com/science/article/pii/50038110111000803.

Krishnan, S., et al.., "A Manufacturable Dual Channel (Si and SiGe) High-K Metal Gate CMOS Technology with Muliple Oxides for High Performance and Low Power Application", IEEE, Feb. 2001 IEEE International Electron Devices Meeting (IEDM), 28.1.1-28.1.4, pp. 634-637.

Lee, J.J., et al., "Theoretical and Experimental Investigation of Si Nanocrystal Memory Device with HfO2 High-K Tunneling Dielectric", IEEE Transactions on Electron Devices, vol. 50, No. 10, Oct. 2003, pp. 2067-2072.

Liu, Z., et al., "Metal Nanocrystal Memories—Part I: Device Design and Fabrication", IEEE Transactions on Electron Devices, vol. 49, No. 9, Sep. 2002, pp. 1606-1613.

Mao, P., et al., "Nonvolatile memory devices with high density ruthenium nanocrystals", Applied Physics Letters, vol. 93, Issue 24, Electronic Transport and Semiconductors, 2006.

Mao. P., et al., "Nonvolatile Memory Characteristics with Embedded high Density Ruthenium Nanocrystals", http://iopscience.iop.org/0256-307X/26/5/056104, Chinese Physics Letters, vol. 26, No. 5, 2009.

Pei, Y., et al., "MOSFET nonvolatile Memory with High-Density Cobalt-Nanodots Floating Gate and HfO2 High-k Blocking Dielectric", IEEE Transactions of Nanotechnology, vol. 10, No. 3, May 2011, pp. 528-531.

(56) References Cited

OTHER PUBLICATIONS

Wang, X.P., et al., Dual Metal Gates with Band-Edge Work Functions on Novel HfLaO High-K Gate Dielectric, IEEE, Symposium on VLSI Technology Digest of Technical Papers, 2006.
U.S. Appl. No. 13/402,426, Hall, M.D., et al., "Non-Volatile Memory Cell and Logic Transistor Integration", Office Action—Allowance—May 3, 2013.
U.S. Appl. No. 13/789,971, Hall, M.D., et al, "Integration Technique Using Thermal Oxide Select Gate Dielectric for Select Gate and Replacement Gate for Logic", Office Action—Allowance—May 15, 2013.
U. S. Appl. No. 13/491,771, Hall et al , "Integrating Formation of a Replacement Ggate Transistor and a Non-Volatile Memory Cell Using a High-K Dielectric", Office Action—Rejection, Sep. 9, 2013.
U.S. Appl. No. 13/442,142, Hall, M.D., et al., "Logic Transistor and Non-Volatile Memory Cell Integration", Office Action—Ex Parte Quayle, Apr. 4, 2013.
U.S. Appl. No. 13/442,142, Hall, M.D., et al., "Logic Transistor and Non-Volatile Memory Cell Integration", Office Action—Allowance, Aug. 2, 2013.
U.S. Appl. No. 13/907,491, Hall, M.D., et al., "Logic Transistor and Non-Volatile Memory Cell Integration", Office Action—Rejection, Sep. 13, 2013.
U.S. Appl. No. 12/915,726, Shroff, M., et al., "Non-Volatile Memory and Logic Circuit Process Integration", Office Action—Restriction, Jul. 31, 2012.
U.S. Appl. No. 12/915,726, Shroff, M., et al., "Non-Volatile Memory and Logic Circuit Process Integration", Office Action—Allowance, Dec. 10, 2012.
U.S. Appl. No. 13/781,727, Shroff, M., et al., "Methods of Making Logic Transistors and non-Volatile Memory Cells", Office Action—Rejection, Aug. 22, 2013.
U.S. Appl. No. 13/077,491, Shroff, M.., et al., "Non-Volatile Memory and Logic Circuit Process Integration", Office Action—Rejection, Aug. 15, 2012.
U.S. Appl. No. 13/077,491, Shroff, M.., et al., "Non-Volatile Memory and Logic Circuit Process Integration", Office Action—Rejection, Feb. 6, 2013.
U.S. Appl. No. 13/077,491, Shroff, M.., et al., "Non-Volatile Memory and Logic Circuit Process Integration", Office Action—Allowance, Jun. 18, 2013.
U.S. Appl. No. 13/077,501, Shroff, M.., et al., "Non-Volatile Memory and Logic Circuit Process Integration", Office Action—Allowance, Nov. 26, 2012.
U.S. Appl. No. 13/313,179, Shroff, M., et al., "Method of Protecting Against Via Failure and Structure Therefor", Office Action—Rejection, Aug. 15, 2013.
U.S. Appl. No. 13/307,719, Shroff, M., et al., "Logic and Non-Volatile Memory (NVM) Integration", Office Action—Allowance, May 29, 2013.
U.S. Appl. No. 13/343,331, Shroff, M., et al., "Non-Volatile Memory (NVM) and Logic Integration", Office Action—Rejection, Mar. 13, 2013.
U.S. Appl. No. 13/343,331, Shroff, M., et al., "Non-Volatile Memory (NVM) and Logic Integration", Office Action—Allowance, Jun. 24, 2013.
U.S. Appl. No. 13/441,426, Shroff, M., et al., "Non-Volatile Memory (NVM) and Logic Integration", Office Action—Allowance, Sep. 9, 2013.
U.S. Appl. No. 13/780,574, Hall, M.D., et al., Non-Volatile Memory (NVM) and Logic Integration, Office Action—Allowance, Sep. 6, 2013.
U.S. Appl. No. 13/491,760, Shroff, M.., et al., "Integrating Formation of a Replacement Gate Transistor and a Non-Volatile Memory Cell Using an Interlayer Dielectric", Office Action—Allowance, Jul. 1, 2013.
U.S. Appl. No. 13/491,771, Hall, M., et al., "Integrating Formation of a Replacement Gate Transistor and a Non-Volatile Memory Cell Using a High-K Dielectric", filed Jun. 8, 2012.
U.S. Appl. No. 13/790,225, Hall, M., et al., "Integrating Formation of a Replacement Gate Transistor and a non-Volatile Memory Cell Having Thin Film Storage", filed Mar. 8, 2013.
U.S. Appl. No. 13/790,014, Hall, M., et al., "Integrating Formation of a Logic Transistor and a None-Volatile Memory Cell Using a Partial Replacement Gate Technique", filed Mar. 8, 2013.
U.S. Appl. No. 13/955,665, Perera, A.H., "Non-Volatile Memory (NVM) and High K and Metal Gate Integration Using Gate First Methodology", filed Jul. 31, 2013.
U.S. Appl. No. 13/962,338, Perera, A.H., "Nonvolatile Memory Bitcell With Inlaid High K Metal Select Gate", filed Aug. 8, 2013.
U.S. Appl. No. 13/928,666, Hong, C. M., et al., "Non-Volatile Memory (NVM) and High Voltage Transistor Integration", filed Jun. 27, 2013.
U.S. Appl. No. 13/780,591, Hall, M.D., et al., "Non-Volatile Memory (NVM) and Logic Integration", filed Feb. 28, 2013.
U.S. Appl. No. 13/491,760, Shroff, M.D., et al., "Integrating Formation of a Replacement Gate Transistor and a Non-Volatile Memory Cell Using an Interlayer Dielectric", filed Jun. 8, 2012.
U.S. Appl. No. 13/661,157, Shroff, M.D., et al., "Method of Making a Logic Transistor and a Non-Volatile Memory (NVM) Cell", file Oct. 26, 2012.
Office Action mailed Nov. 22, 2013 in U.S. Appl. No. 13/780,591.
Office Action—Allowance mailed Feb. 21, 2014 in U.S. Appl. No. 13/441,426.
Office Action—Allowance mailed Feb. 28, 2014 in U.S. Appl. No. 13/442,142.
Office Action—Allowance mailed Mar. 3, 2014 in U.S. Appl. No. 13/790,014.
Office Action—Allowance mailed Mar. 6, 2014 in U.S. Appl. No. 13/491,771.
Office Action—Allowance mailed Mar. 11, 2014 in U.S. Appl. No. 13/907,491.
Office Action—Allowance mailed Mar. 12, 2014 for U.S. Appl. No. 13/790,225.
Office Action mailed Jan. 31, 2014 in U.S. Appl. No. 13/781,727.
Office Action mailed Dec. 24, 2013 in U.S. Appl. No. 13/790,225.
Office Action mailed Dec. 24, 2013 in U.S. Appl. No. 13/790,014.
Office Action mailed Dec. 31, 2013 in U.S. Appl. No. 13/442,142.
Office Action mailed Jan. 16, 2014 in U.S. Appl. No. 13/491,771.
U.S. Appl. No. 13/928,666, Hong, Office Action—Rejection, mailed Jul. 23, 2014.
U.S. Appl. No. 14/041,662, Perera, Office Action—Restriction, mailed Aug. 1, 2014.
U.S. Appl. No. 13/781,727, Shroff, Office Action—Allowance, mailed Aug. 15, 2014.
U.S. Appl. No. 13/973,549, Hong, Office Action—Restriction, mailed Aug. 26, 2014.
U.S. Appl. No. 13/955,665, Office Action—Allowance, mailed Aug. 20, 2014.

* cited by examiner

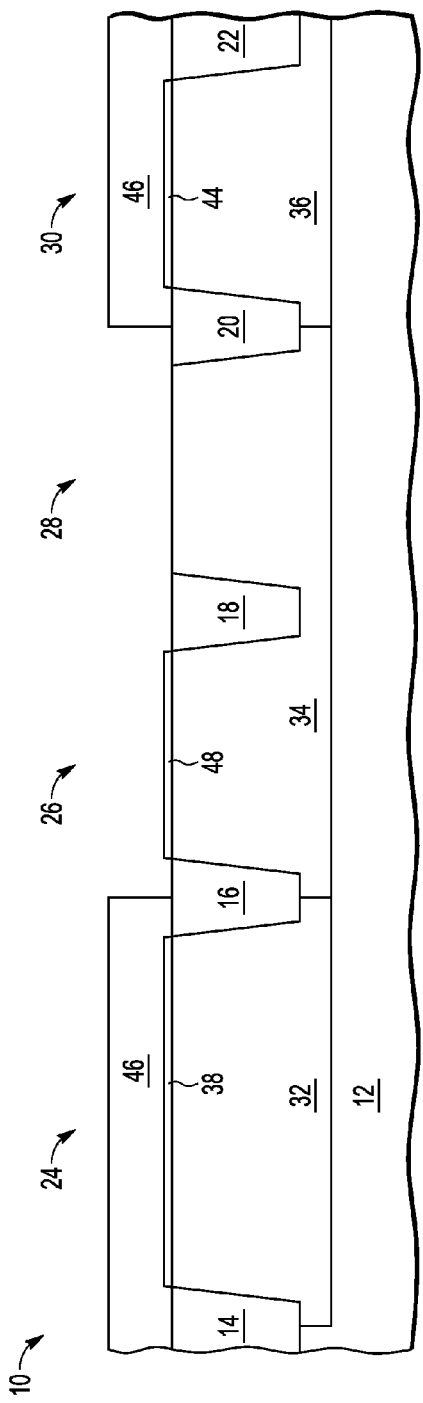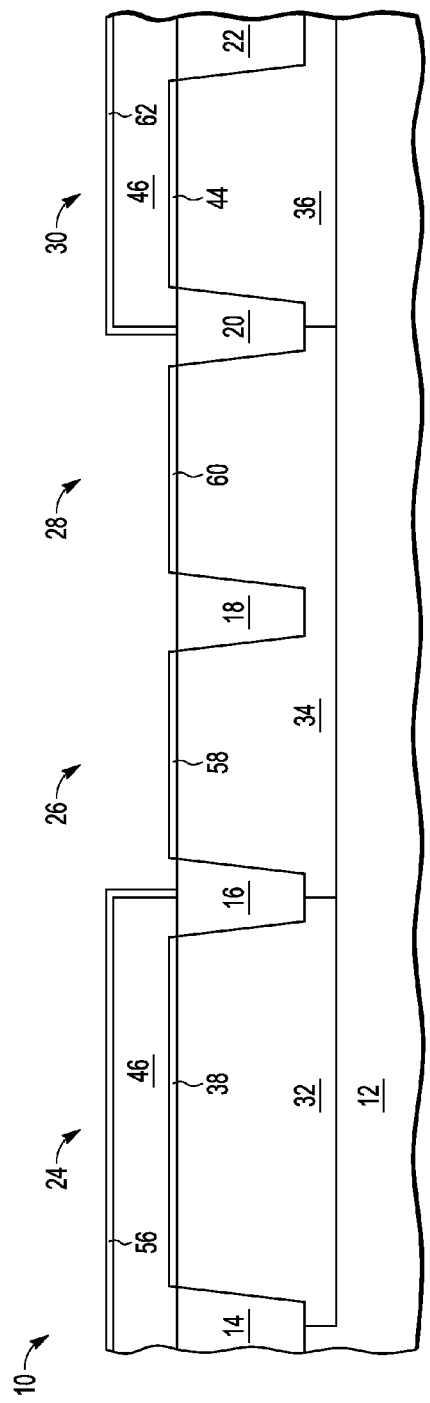

US 8,877,585 B1

NON-VOLATILE MEMORY (NVM) CELL, HIGH VOLTAGE TRANSISTOR, AND HIGH-K AND METAL GATE TRANSISTOR INTEGRATION

BACKGROUND

1. Field

This disclosure relates generally to non-volatile memory (NVM) cells and other transistor types, and more particularly, integrating NVM cells with logic transistors that have high k gate dielectrics and metal gates and transistors that are high voltage.

2. Related Art

The integration of non-volatile memories (NVMs) with logic transistors has always been a challenge due to the different requirements for the NVM transistors, which store charge, and the logic transistors which are commonly intended for high speed operation. The need for storing charge has been addressed mostly with the use of floating gates but also with nanocrystals or nitride. In any of these cases, the need for this unique layer makes integration of the NVM transistors and the logic transistors difficult. The particular type of charge storage layer can also have a large effect on the options that are available in achieving the integration. A further complication is when the logic transistors are high k, metal gate transistors and high voltage transistors. The high k gate dielectrics typically cannot withstand the high temperatures that are generally best for NVM cells and for high voltage transistors. Further the high voltage transistors typically have relatively thick layers of oxide for the gate dielectrics that, when etched, can cause a corresponding recess of the isolation oxide exposing the sidewall surface of logic transistor channel regions. The exposure of the transistor region sidewall surface makes it difficult to control the threshold voltage of the transistors and accordingly makes for a leakage problem for those transistors.

Accordingly there is a need to provide an integration that improves upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 5 is a cross section of the semiconductor structure of FIG. 4 at a subsequent stage in processing;

FIG. 6 is a cross section of the semiconductor structure of FIG. 5 at a subsequent stage in processing;

DETAILED DESCRIPTION

In one aspect, an integration of a non-volatile memory (NVM) cell in a NVM portion of an integrated circuit and a logic transistor in a logic portion of the integrated circuit includes forming the gate structure of the NVM cell in the NVM portion, including the charge storage layer, while masking the logic portion. The logic gate is formed while masking the NVM portion with a hard mask that is subsequently used to form sidewall spacers in the NVM portion. Source/drain implants are performed simultaneously in the NVM and logic portions. This is better understood by reference to the drawings and the following written description.

The semiconductor substrate described herein can be any semiconductor material or combinations of materials, such as gallium arsenide, silicon germanium, silicon-on-insulator (SOD, silicon, monocrystalline silicon, the like, and combinations of the above. Oxide layer refers to a silicon oxide layer unless otherwise noted. Similarly, nitride layer refers to a silicon nitride layer unless otherwise noted.

Figure 1:
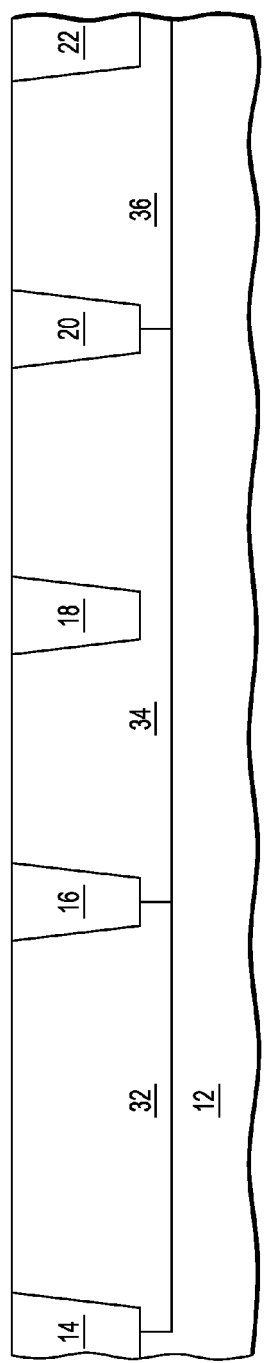
FIG. 1 is a cross section of a semiconductor structure having a non-volatile memory (NVM) structure and a logic transistor structure at a stage in processing according to an embodiment.

Shown in FIG. 1 is a semiconductor structure 10 of an integrated circuit having a substrate 12, an isolation region 14 in substrate 12, an isolation region 16 in substrate 12, an isolation region 18 in substrate 12, an isolation region 20 in substrate 12, and an isolation region 22 in substrate 12. An NVM portion 24 is between isolation regions 14 and 16, a first high voltage portion 26 is between isolation regions 16 and 18, a second high voltage portion 28 is between isolation regions 18 and 20, and a logic portion 30 is between isolation regions 20 and 22. Substrate 12 has a well 32 in NVM portion 24, a well 34 in first and second high voltage portions 26 and 28, and a well 36 in logic portion 30. Wells 32, 34 and 36 may be P type wells and substrate 12 may be P type. N type wells, not shown, may also be present.

Figure 2:
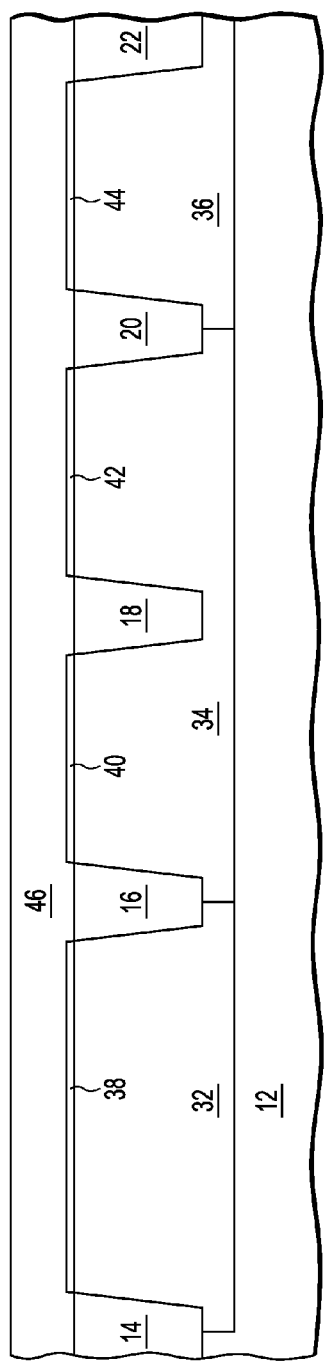
FIG. 2 is a cross section of the semiconductor structure of FIG. 1 at a subsequent stage in processing.

Shown in FIG. 2 is semiconductor structure 10 after growing an oxide layer 38 on substrate 12 in NVM portion 24, an oxide layer 40 on substrate 12 in first high voltage portion 26, an oxide layer 42 on substrate 12 in second high voltage portion 28, an oxide layer 44 on substrate 12 in logic portion 30, a polysilicon layer 46 on isolation regions 14, 16, 18, 20, and 22 and on oxide layers 38, 40, 42, and 44, which are relatively thin and may be about 30 Angstroms thick. Oxide layers are grown to be high quality and be grown at a temperature of 900 degress Celsius or even more. Polysilicon layer 46 may be about 600 Angstroms thick.

Figure 3:
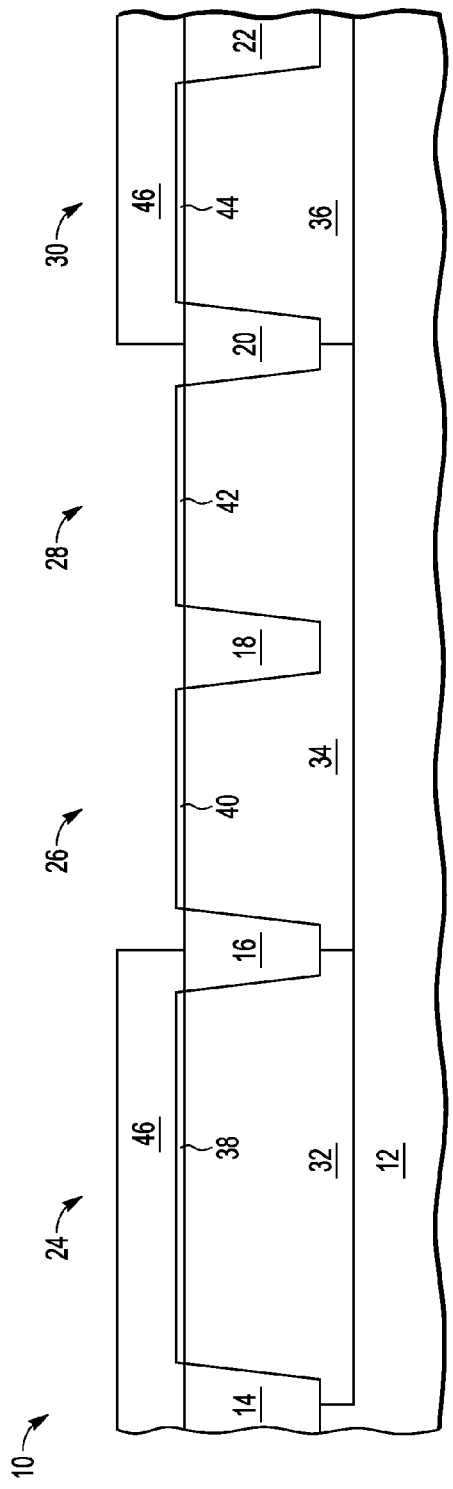
FIG. 3 is a cross section of the semiconductor structure of FIG. 2 at a subsequent stage in processing.

Shown in FIG. 3 is semiconductor structure 10 after patterning polysilicon layer 46 to leave a portion of polysilicon layer 46 over oxide layer 38 and portions of isolation regions 14 and 16 and to leave a portion of polysilicon layer 46 over oxide layer 44 and portions of isolation regions 20 and 22. This patterning, as is common for patterned etches, uses photoresist as a mask.

Figure 4:
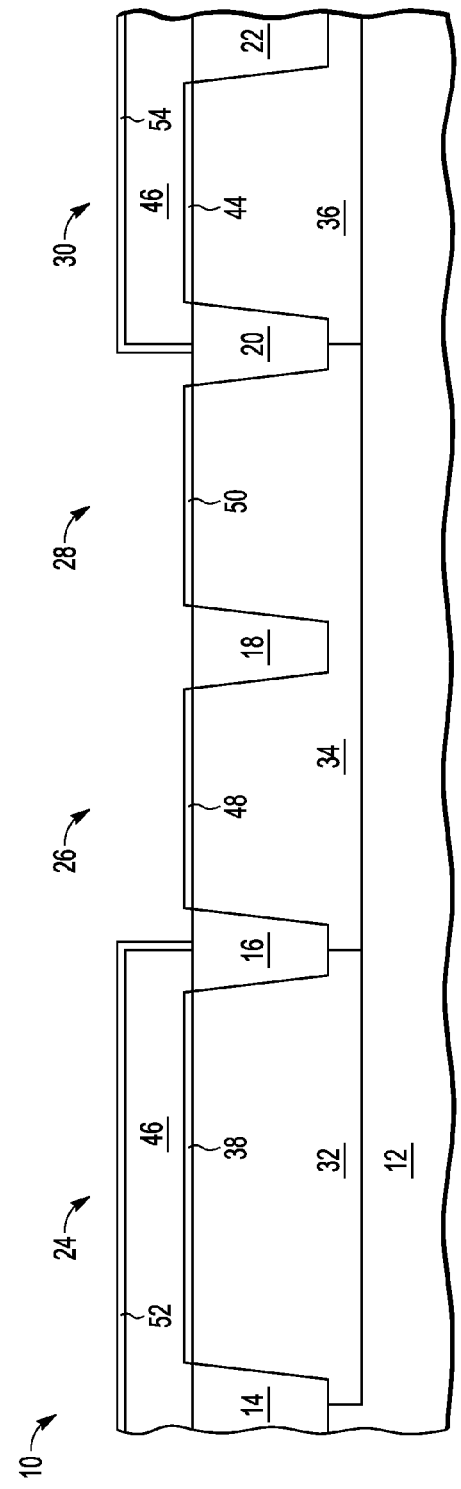
FIG. 4 is a cross section of the semiconductor structure of FIG. 3 at a subsequent stage in processing.

Shown in FIG. 4 is semiconductor structure 10 after removing oxide layers 40 and 42 and growing oxide layers 48 and 50 to about 100 Angstroms. With oxide layers 40 and 42 being thin, there is minimal impact on isolation regions 16, 18, and 20 due to the etch that removes oxide layers 40 and 42. Isolation regions 16, 18, and 20, as well as isolation regions 14 and 22, may be about 2500 Angstroms deep. Further, the oxide growth of oxide layers 48 and 50 consumes some of substrate 12 where they are grown. The effect is that the top surface of substrate 12 in high voltage portions 26 and 28 remains nearly coplanar with isolation region 18 and the portions of isolation regions 16 and 20 interfacing with high voltage portions 26 and 28. During the growth of oxide layers 48 and 50, an oxide layer 52 is grown on the portion of polysilicon layer 46 in NVM portion 24, and an oxide layer 54 is grown on the portion of polysilicon layer 46 in logic portion 30.

Shown in FIG. 5 is semiconductor structure 10 after performing a patterned etch of oxide layer 50, 52 and 54. This leaves oxide layer 48 in first high voltage portion 26.

Shown in FIG. 6 is semiconductor structure 10 after growing an oxide layer 60 on the top surface of substrate 12 in second high voltage portion 28 and also growing additional oxide in the first high voltage portion 26 to result in oxide layer 58 that is thicker than oxide layer 48 of first high voltage portion 26 and thicker than oxide layer 60. Oxide layer 60 may be grown to be 125 Angstroms so that the resulting thickness of oxide layer 58 is about 200 Angstroms. The growth rate of oxide decreases as the thickness increases. This oxide growth thickens oxide layers 56 and 62 also. Some consumption of the top surface of substrate 12 in high voltage portions 26 and 28 occurs. Immediately prior to this oxide growth is a pre-clean which will etch exposed oxide. During this pre-clean, isolation regions 14 and 16, where they meet with the top surface of substrate 12 in NVM portion 24, and isolation regions 20 and 22, where they meet with the top surface of substrate 12 in logic portion 30, are protected by the remaining portions of polysilicon layer 46. With oxide layer 58 being thicker than oxide layer 60, second high voltage portion 28 may be considered a medium voltage portion.

Figure 7:
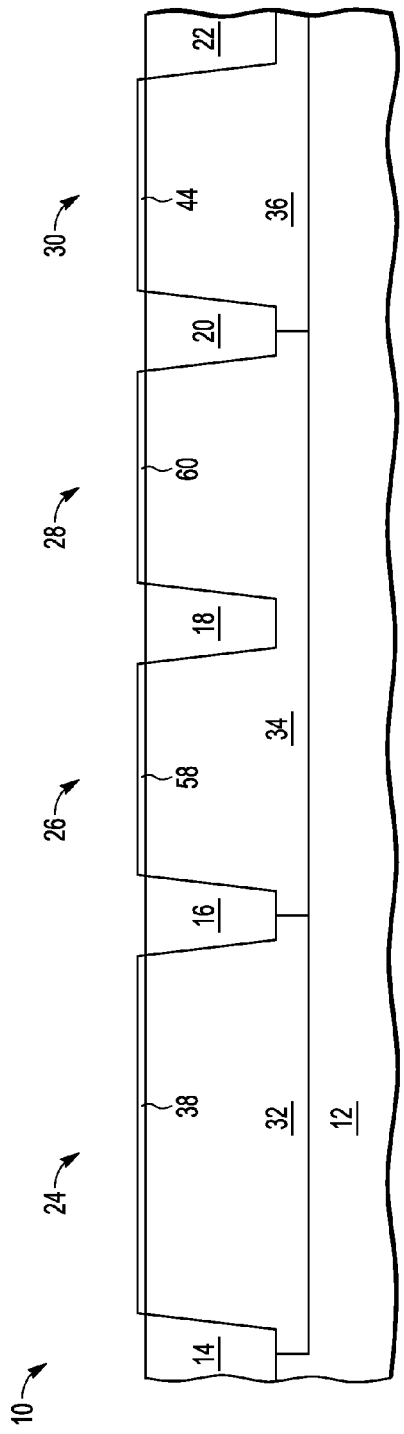
FIG. 7 is a cross section of a semiconductor structure at a stage in processing according to a second embodiment.

Shown in FIG. 7 is semiconductor structure 10 after performing a patterned etch to remove oxide layers 56 and 62 and the remaining portions of polysilicon layer 46. During this etch, isolation regions 16 and 18, where they meet with the top surface of substrate 12 in first high voltage portion 26, and isolation regions 18 and 20, where they meet with the top surface of substrate 12 in second high voltage portion 28, are protected using a photoresist mask.

Figure 8:
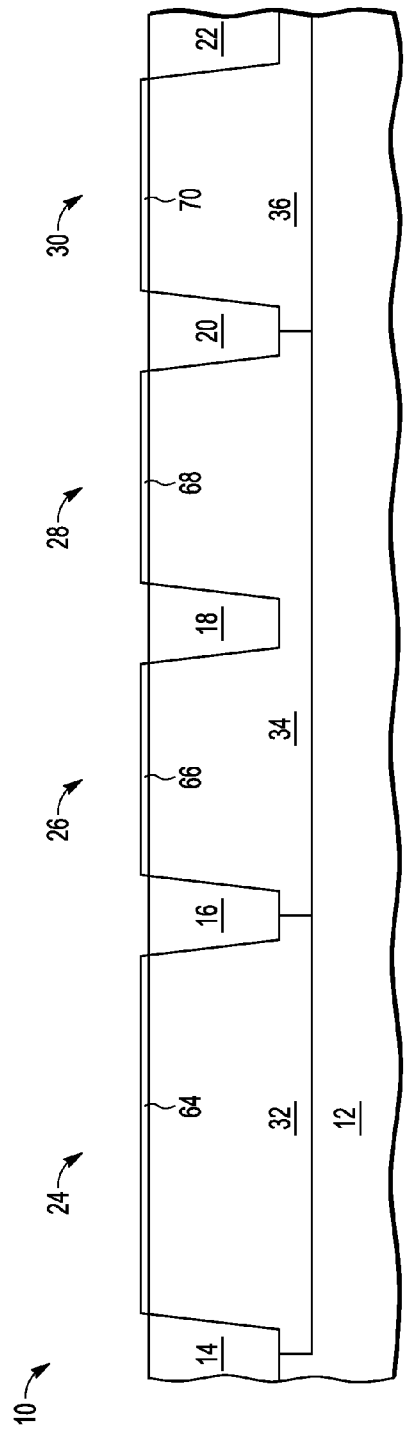
FIG. 8 is a cross section of the semiconductor structure of FIG. 7 at a subsequent stage in processing.

Shown in FIG. 8 is semiconductor structure 10 after pattern etching to remove oxide layers 38 and 44 which are both quite thin, only about 30 Angstroms. A growth of oxide is then performed on NVM portion 24, high voltage portions 26 and 28, and logic portion 30. The result is an oxide layer 64 in NVM portion 24 and an oxide layer 70 in logic portion 30 both of about 26 to 32 Angstroms in thickness. This causes a further growth of oxide in high voltage portions 26 and 28 of about 15 to 20 Angstroms to result in oxide layer 66 in first high voltage portion 26 and oxide layer 68 in second high voltage portion 28.

Figure 9:
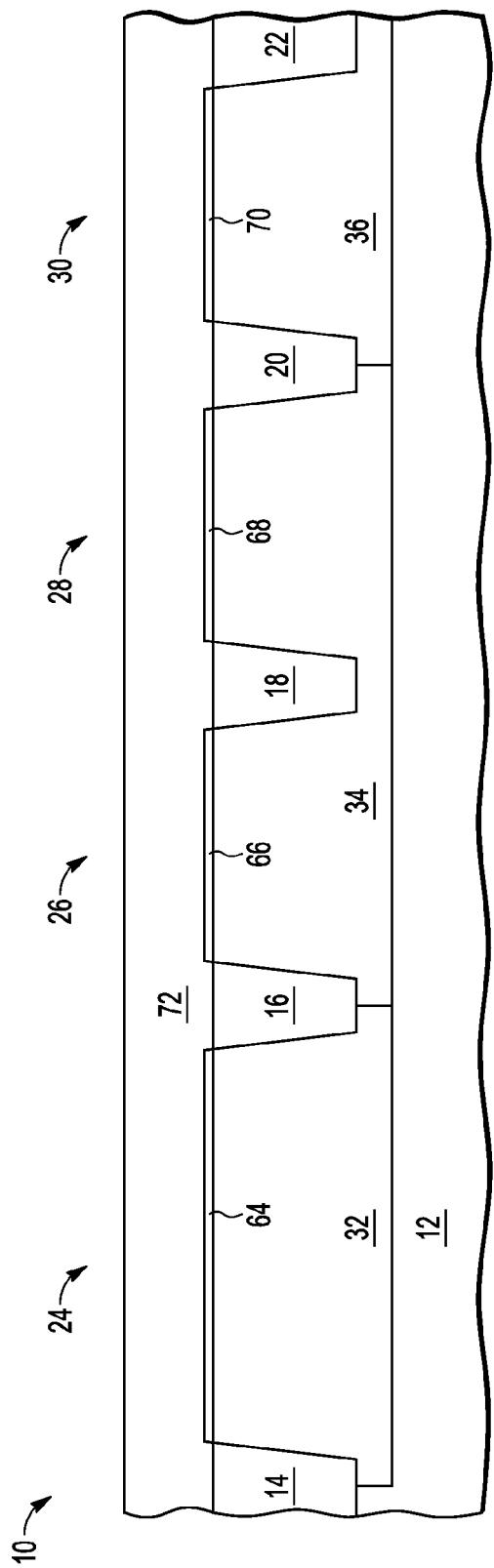
FIG. 9 is a cross section of the semiconductor structure of FIG. 8 at a subsequent stage in processing.

Shown in FIG. 9 is semiconductor structure 10 after depositing a polysilicon layer 72 in NVM portion 24, high voltage portions 26 and 28, and logic portion 30 to cover oxide layers 64, 66, 68, and 70 and isolation portions 14, 16, 18, 20, and 22. Polysilicon layer 72 may be about 800 Angstroms in thickness.

Figure 10:
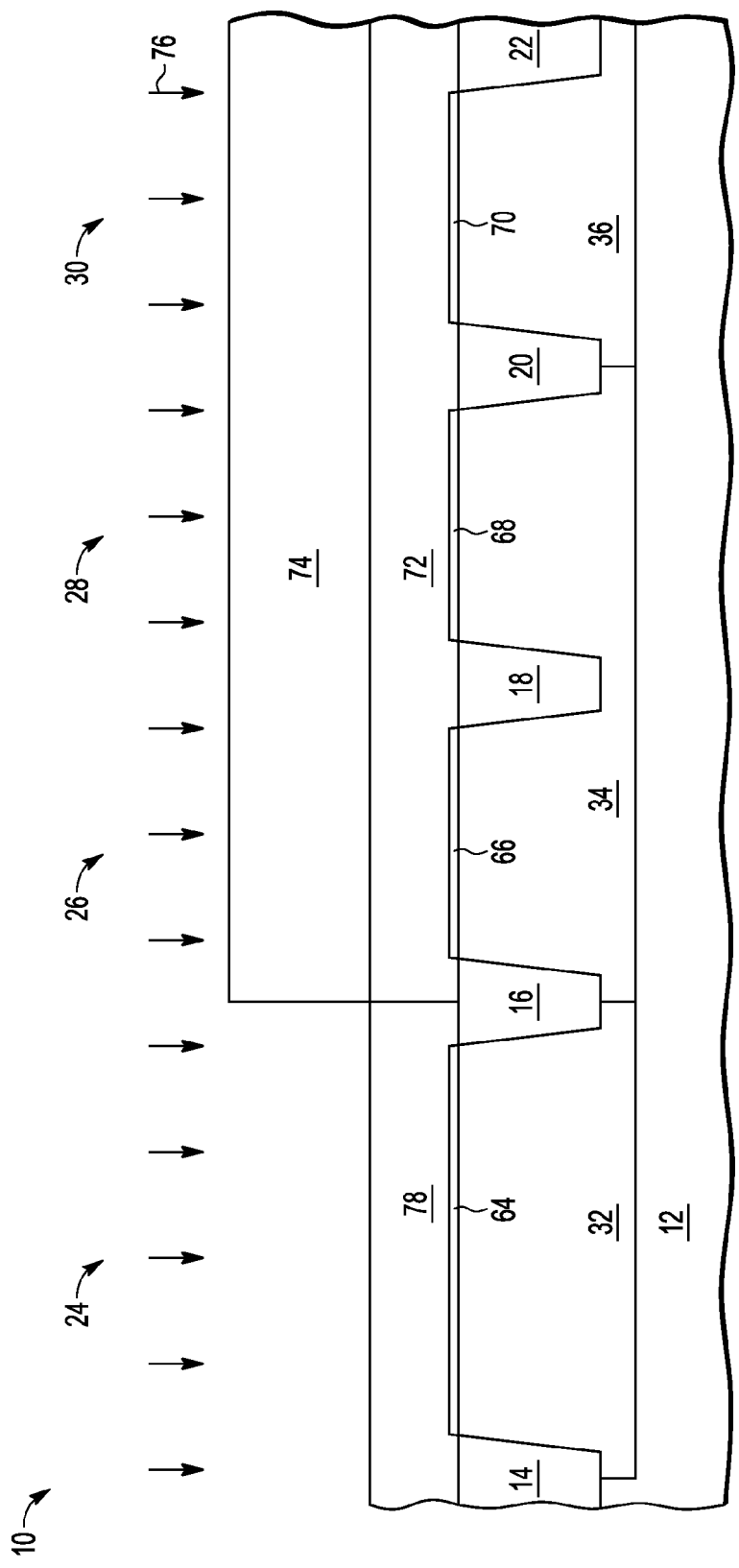
FIG. 10 is a cross section of the semiconductor structure of FIG. 9 at a subsequent stage in processing.

Shown in FIG. 10 is semiconductor structure 10 after forming a patterned photoresist layer 74 over high voltage portions 26 and 28 and logic portion 30 and performing an implant so as to form a doped polysilicon layer 78 from polysilicon layer 72. This ensures that control gates subsequently formed from doped polysilicon layer 78 will be sufficiently conductive.

Figure 11:
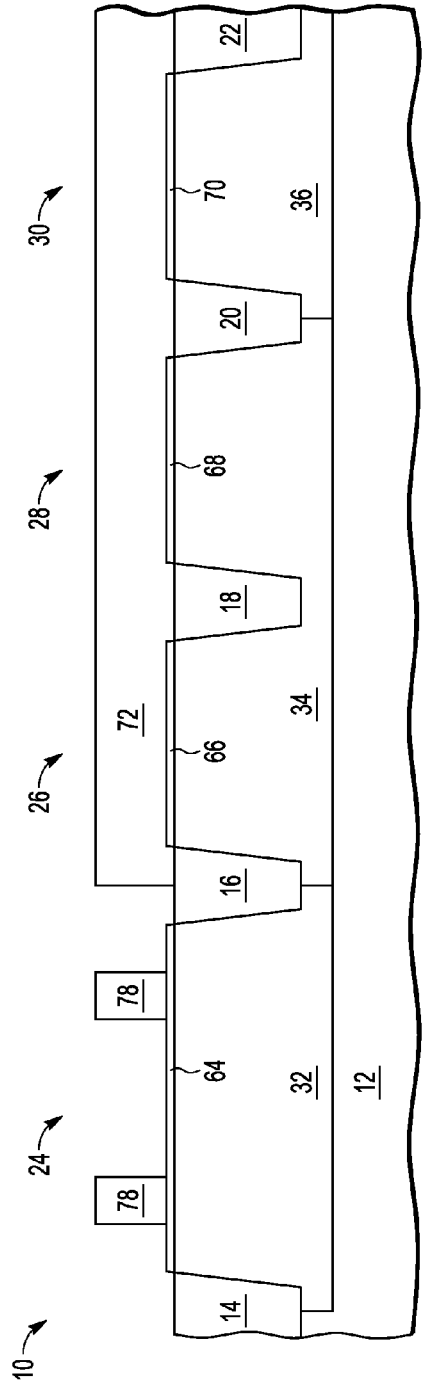
FIG. 11 is a cross section of the semiconductor structure of FIG. 10 at a subsequent stage in processing.

Shown in FIG. 11 is semiconductor structure 10 after doped polysilicon layer 78 is patterned to form a first select gate from the portion of doped polysilicon layer 78 nearer isolation region 14 and a second select gate from the portion of doped polysilicon layer 78 nearer isolation region 16.

Figure 12:
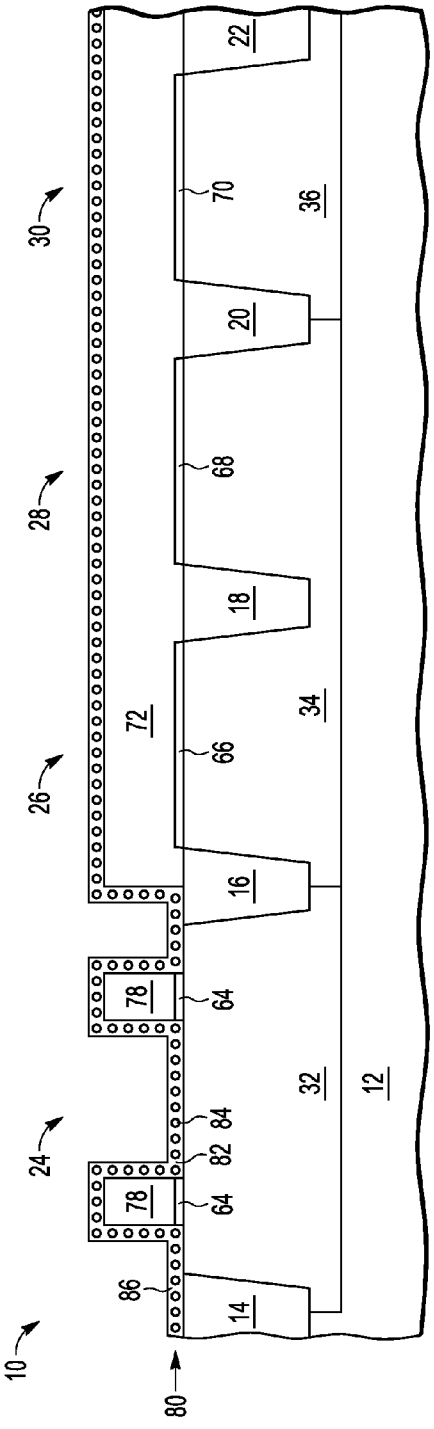
FIG. 12 is a cross section of the semiconductor structure of FIG. 11 at a subsequent stage in processing.

Shown in FIG. 12 is semiconductor structure 10 after forming a charge storage layer 80 in NVM portion 24, high voltage portions 26 and 28, and logic portion 30. Charge storage layer 80 is formed from a bottom oxide 82, a plurality of nanocrystals of which nanocrystal 84 is representative, and a top oxide 86 that is between and over the nanocrystals. Charge storage layer is over polysilicon layer 72 in high voltage portions 26 and 28 and in logic portion 30. In NVM portion 24, charge storage layer 80 is over, between, along the sidewalls of the first and second select gates formed from doped polysilicon layer 78. Charge storage layer is over substrate 12 in NVM portion 24 in the regions between the isolation regions 14 and 16 and the select gates formed from doped polysilicon layer 78.

Figure 13:
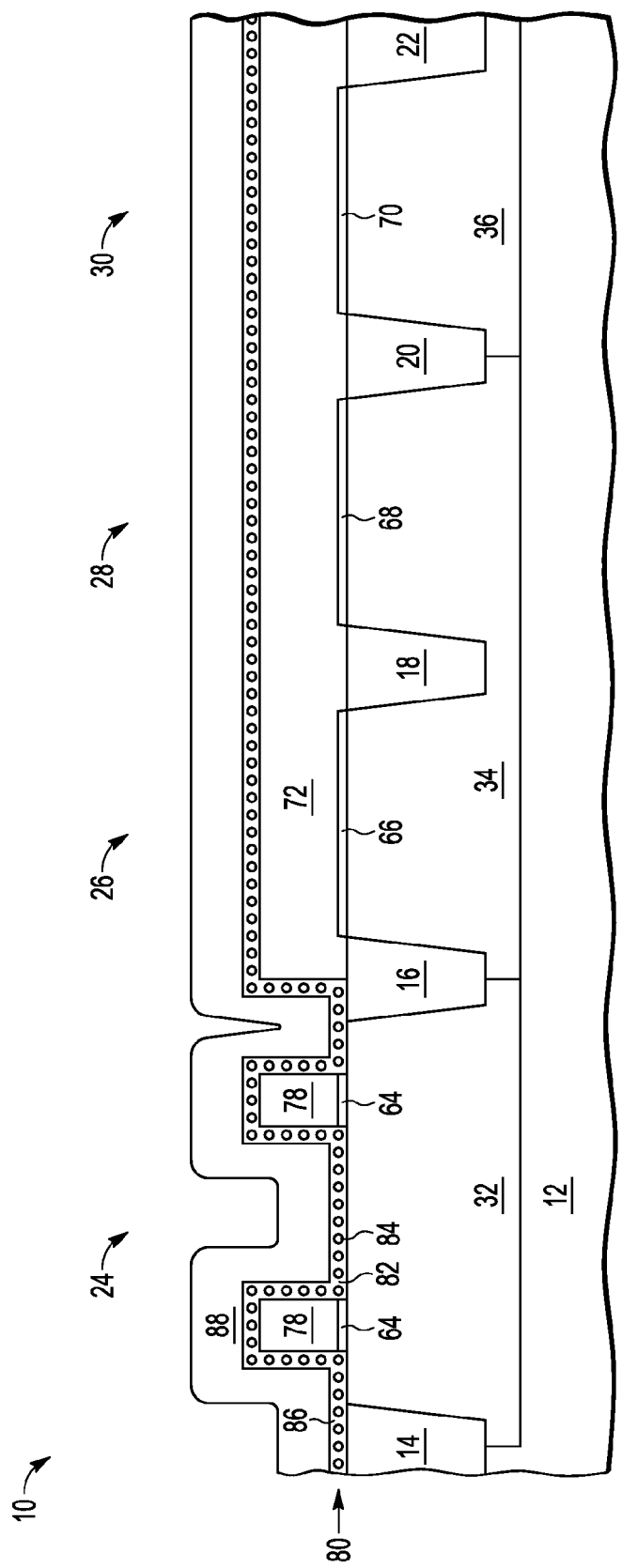
FIG. 13 is a cross section of the semiconductor structure of FIG. 12 at a subsequent stage in processing.

Shown in FIG. 13 is semiconductor structure 10 after depositing a polysilicon layer 88 over charge storage layer 80 in NVM portion 24, high voltage portions 26 and 28, and logic portion 30.

Figure 14:
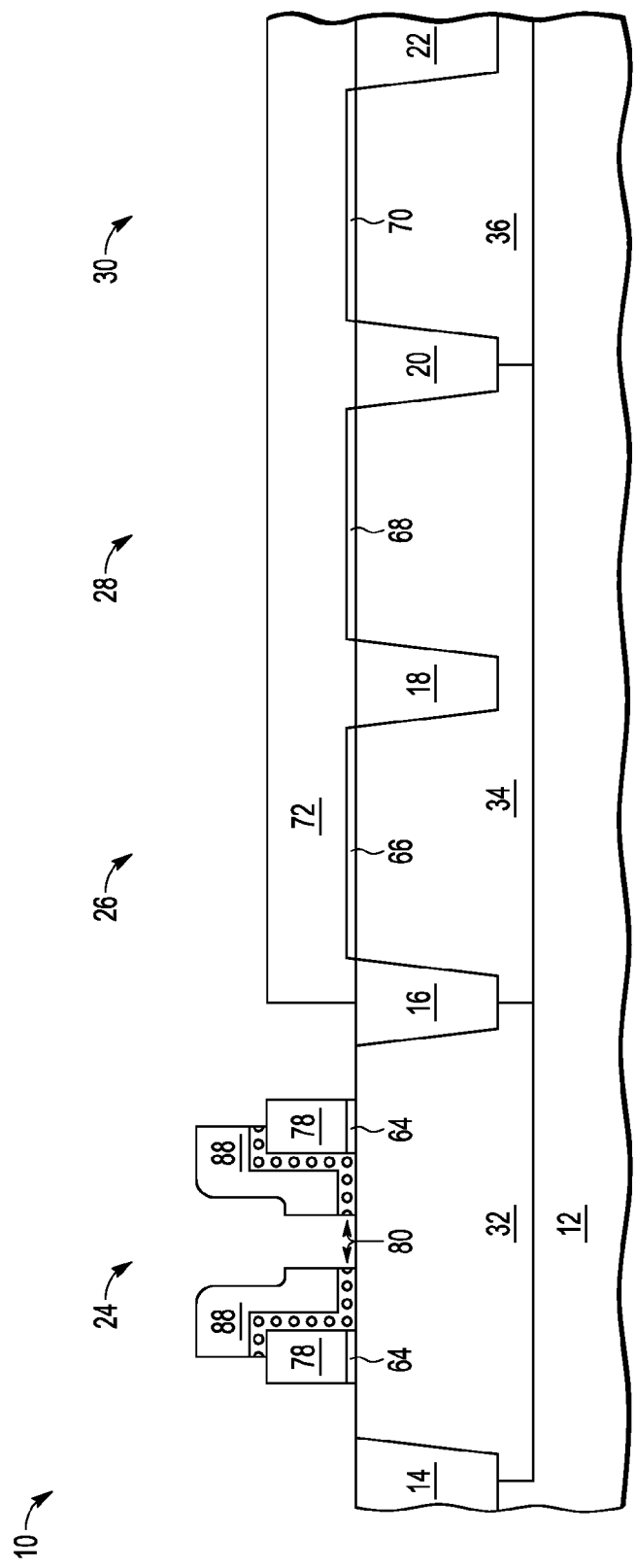
FIG. 14 is a cross section of the semiconductor structure of FIG. 13 at a subsequent stage in processing.

Shown in FIG. 14 is semiconductor structure 10 after a pattered etch of polysilicon layer 88 and charge storage layer 80 to form control gate by leaving a first portion of polysilicon layer 88 as a control gate over and along a right side the first portion of polysilicon layer 78 and a second portion of polysilicon layer 88 over and along a left side of the second portion of polysilicon layer 78. Polysilicon layer 88 is removed over high voltage portions 26 and 28 and logic portion 30. The first portion of polysilicon layer 88 extends laterally to right from the first portion of polysilicon layer 78, and the second portion of polysilicon layer 88 extends laterally to the left from the second portion of polysilicon layer 78. Charge storage layer 80 is between the first portions of polysilicon layers 78 and 88 and between the second portions of polysilicon layers 78 and 88. The result is two gate stacks each of a select gate over oxide layer 64, a control gate having a portion over charge storage layer where charge storage layer is on the top surface of substrate 12, a portion along one side of the select gate, and a portion over a top portion of the select gate in which charge storage layer is between the select gate and the control gate.

Figure 15:
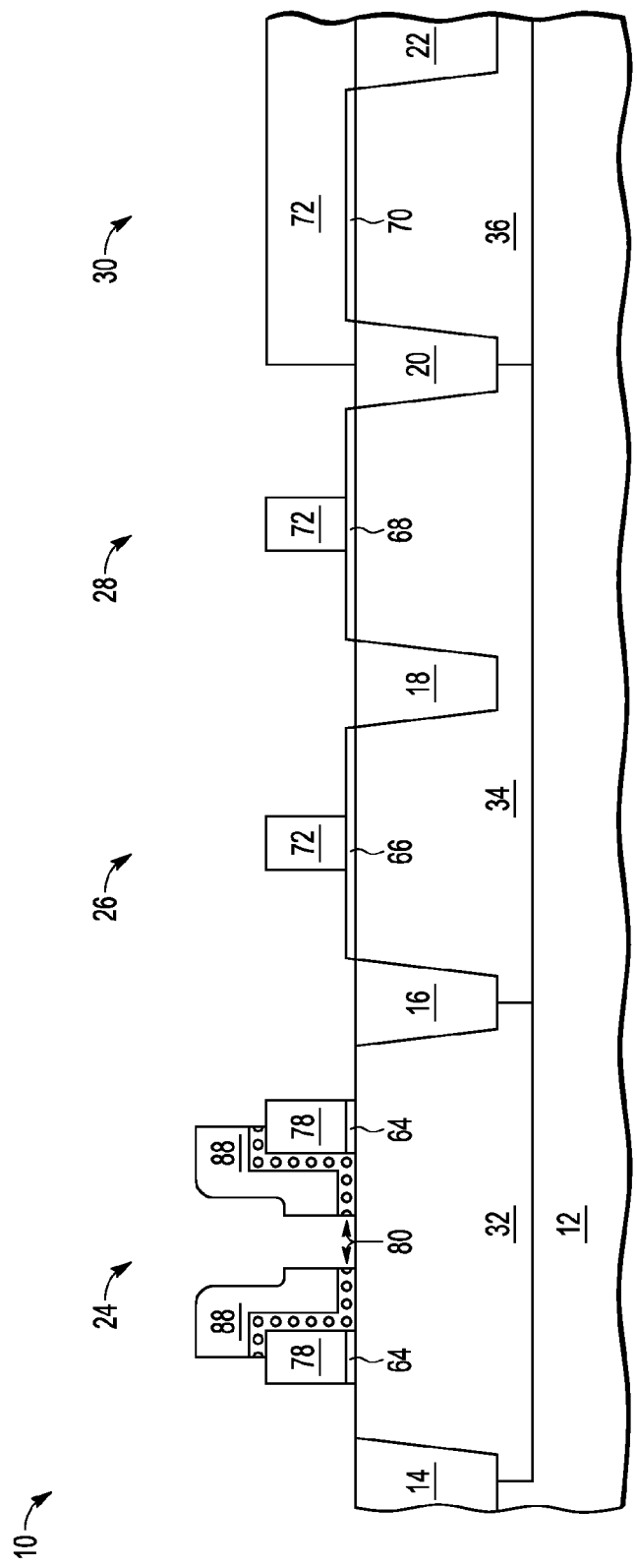
FIG. 15 is a cross section of the semiconductor structure of FIG. 14 at a subsequent stage in processing.

Shown in FIG. 15 is semiconductor structure 10 after a patterned etch of polysilicon layer 72 to leave a portion in first high voltage portion 26 as a gate for a high voltage transistor and a portion in second high voltage portion 28 as a gate for a high voltage transistor. Oxide layer 66 is the gate dielectric for the high voltage transistor of first high voltage portion 26 and oxide layer 68 is the gate dielectric for the high voltage transistor of second high voltage portion 28. Polysilicon layer 72 remains over logic portion 30. Thus the gate structures for NVM portion 24 and high voltage portions 26 and 28 are completed.

Figure 16:
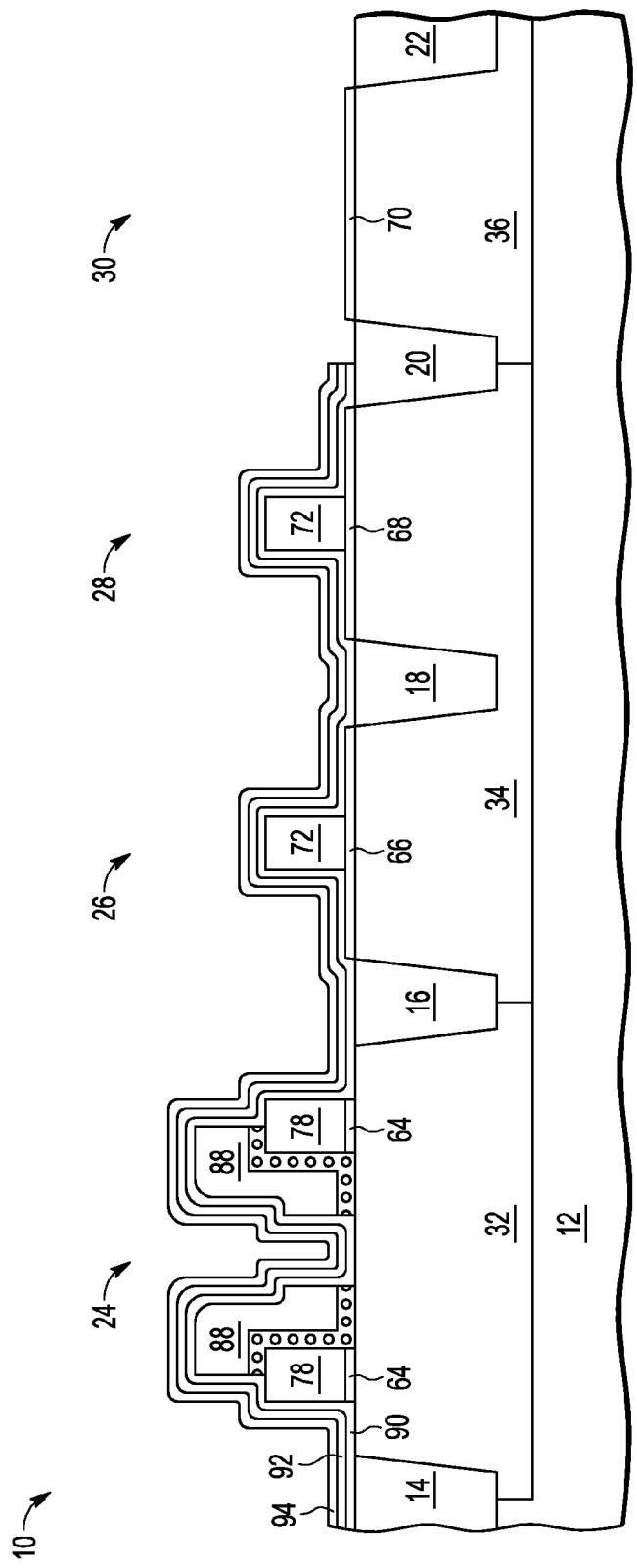
FIG. 16 is a cross section of the semiconductor structure of FIG. 15 at a subsequent stage in processing.

Shown in FIG. 16 is semiconductor structure 10 after depositing an oxide layer 90, a nitride layer 92, and an oxide layer 94 and then patterning to remove oxide layer 90, nitride layer 92, oxide layer 94, and polysilicon layer 72 from logic portion 30. Oxide layer 90 has a thickness chosen for forming a sidewall spacer that will function as a mask for an extension implant. The result is that the gate structures for NVM portion 24 and high voltage portions 26 and 28 are protected by oxide layer 90, nitride layer 92, and oxide layer 94 and logic portion 30 only has oxide layer 70 which is easily removed by a preclean which also removes oxide layer 94.

Figure 17:
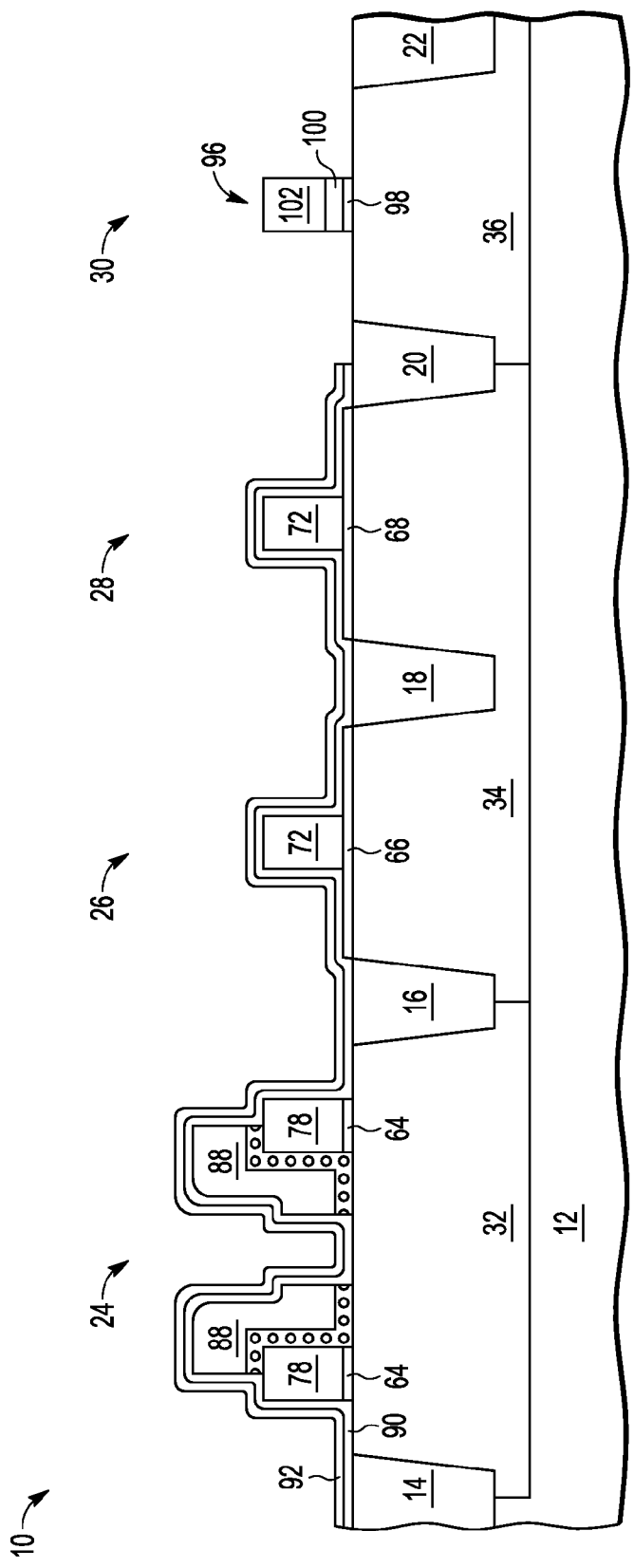
FIG. 17 is a cross section of the semiconductor structure of FIG. 16 at a subsequent stage in processing.

Shown in FIG. 17 is semiconductor structure 10 after forming a gate structure 96 having a high k dielectric 98, a work function metal 100, and an upper gate 102 that may be polysilicon. This shows completed gate structures for NVM portion 24, high voltage portions 26 and 28, and logic portion 30. These are achieved with etches that only minimally impact the portions of isolation regions 20 and 22 that adjoin well 36. After the removal oxide layer 70, there are no oxide etches required to reach the result shown in FIG. 17. Beginning with the coplanar structure shown in FIG. 1, the only oxide etches that contact isolation regions 20 and 22 where they adjoin well 36 prior to the formation of gate structure 96 are the ones that remove oxide layer 44 and oxide layer 70 both of which are quite thin and have little impact on the coplanarity between the top surface of substrate 12 in logic portion 30 and the top surfaces of isolation regions 20 and 22. After formation of gate structure 96, the oxide etches that may impact isolation regions 20 and 22 have minimal impact because the gate has already crossed the isolation region so that subsequent etches have minimal if any impact on the type of leakage caused by the etching that results in a significant deviation from coplanarity between isolation regions and active regions. The areas of wells 32, 34, and 36 at and near the surface may be considered active regions.

Figure 18:
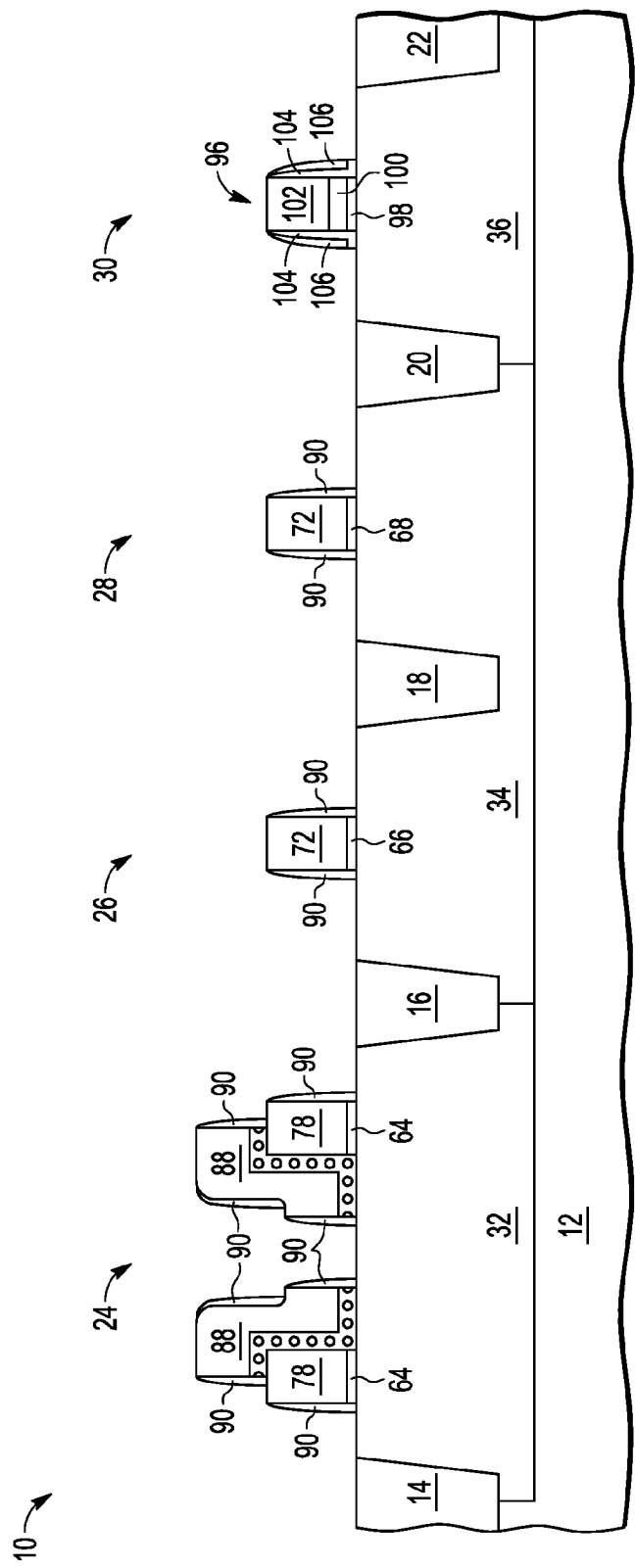
FIG. 18 is a cross section of the semiconductor structure of FIG. 17 at a subsequent stage in processing.

Shown in FIG. 18 is semiconductor structure 10 after forming sidewall spacers around the gate structures of NVM portion 24 and high voltage portions 26 and 28 using oxide layer 90 as shown in FIGS. 17 and 18. Prior to formation of sidewall spacers from oxide layer 90, a nitride layer and an oxide layer is deposited for use in forming a sidewall spacer 104 of nitride around gate structure 96 and a sidewall spacer 106 of oxide around sidewall spacer 104.

Figure 19:
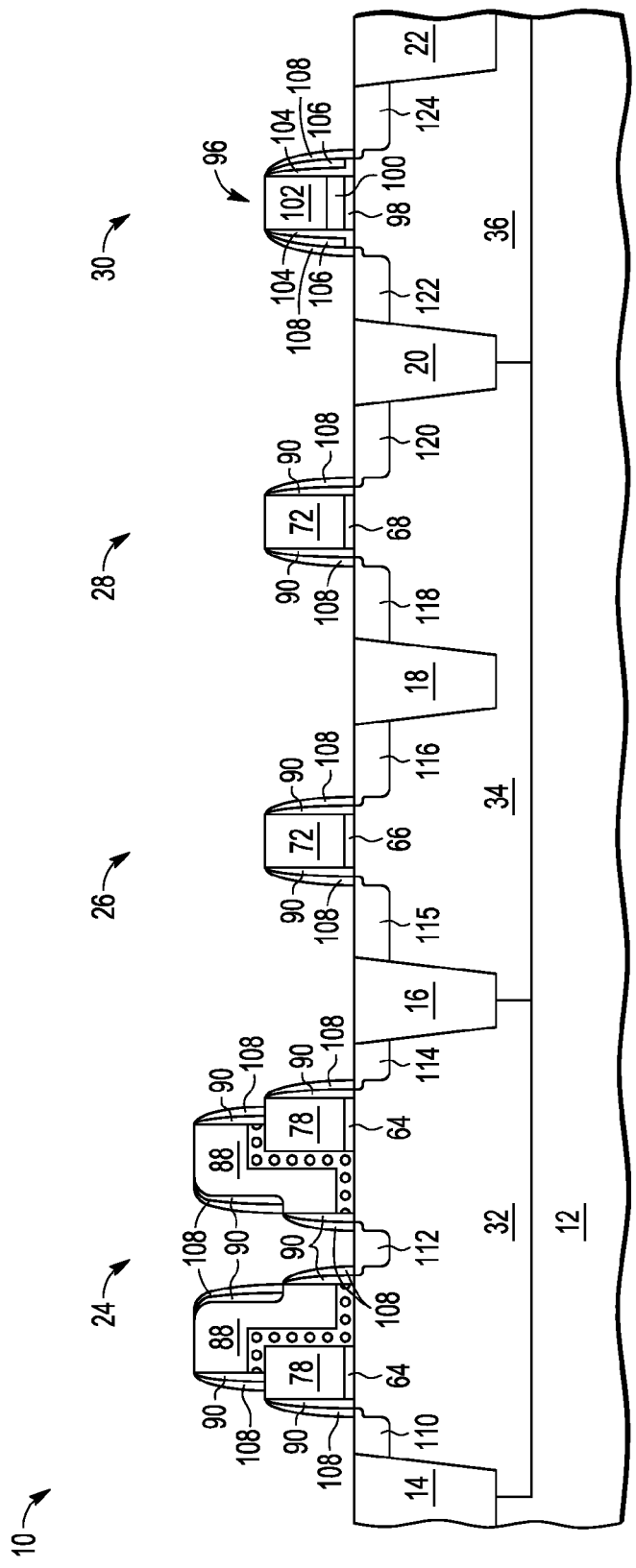
FIG. 19 is a cross section of the semiconductor structure of FIG. 18 at a subsequent stage in processing.

Shown in FIG. 19 after performing extension implants; forming sidewall spacers 108 of oxide around the gate structures of NVM portion 24, high voltage portions 26 and 28, and a logic portion 30; and performing deep source/drain implants. These source/drain implants are effective in making the gates sufficiently conductive. The result is source/drain regions 110, 112, and 114 in NVM portion 24; source/drain regions 115 and 116 in first high voltage portion 26; source/drain regions 118 and 120 in second high voltage portion 28; and source/drain regions 122 and 124 in logic portion 30.

The structure shown in FIG. 15 shows how gates, including gates with varying thicknesses of grown oxide, can be achieved with minimal effect on the isolation regions defining a perimeter of a logic transistor to be formed using a high k dielectric for the gate dielectric and metal directly on the gate dielectric. The most likely oxides to cause a major deviation from coplanarity between active and isolation are the ones for forming thick oxides for high voltage operation which in this case are oxides 66 and 68. Corresponding oxides were not grown in logic portion 30. Also the etching of these oxides were blocked at the active/isolation interface for logic portion 30.

By now it should be appreciated that there has been provided a method of making a semiconductor device. The method includes using a substrate having a non-volatile memory (NVM) portion, a high voltage portion, a medium voltage portion, and a logic portion. The method further includes growing a first oxide on a major surface of the substrate in the NVM portion, the high voltage portion, the medium voltage portion, and logic portion. The method further includes depositing a first conductive layer over the first oxide in the NVM portion, the high voltage portion, the medium voltage portion, and the logic portion. The method further includes patterning and etching the first conductive layer to expose the high voltage portion and the medium voltage portion. The method further includes growing a second oxide in the NVM portion, the high voltage portion, the medium voltage portion, and the logic portion. The method further includes masking the high voltage portion. The method further includes etching the second oxide from the NVM portion, medium voltage portion, and the logic portion while the high voltage portion is masked. The method further includes growing a third oxide in the NVM portion, the high voltage portion, the medium voltage portion, and the logic portion. The method further includes masking the high voltage portion and the medium voltage portion. The method further includes etching the third oxide and the first conductive layer in the NVM portion and the logic portion while the high voltage portion and the medium voltage portion remain masked. The method further includes growing a fourth oxide in the NVM portion, the high voltage portion, the medium voltage portion, and the logic portion. The method further includes fabricating a memory cell requiring high voltage during operation in the NVM portion, the fabricating including using a protective layer over the high voltage portion, the medium voltage portion, and the logic portion when performing an implant in a second conductive layer in the NVM portion. The method further includes removing the protective layer over the high voltage portion, the medium voltage portion, and the logic portion. The method further includes patterning transistor gates in the high voltage portion and the medium voltage portion. The method further includes depositing a protective mask in the NVM portion, the high voltage portion, and the medium voltage portion. The method further includes forming a logic device in the logic portion while the protective mask remains in the NVM portion, the high voltage portion, and the medium voltage portion. The method may have a further characterization by which the fabricating the memory cell further includes forming a select gate by implanting the second conductive layer and patterning the second conductive layer and the fourth oxide, forming a charge storage layer over the select gate and the substrate in the NVM portion, and in the high voltage portion, the medium voltage portion, and the logic portion, depositing a third conductive layer over the charge storage layer in the NVM portion, the high voltage portion, the medium voltage portion, and the logic portion, and patterning the third conductive layer and the charge storage layer to form a control gate over a remaining portion of the charge storage layer and a portion of the select gate in the NVM portion, and to remove the charge storage layer and the third conductive layer in the high voltage portion, the medium voltage portion, and the logic portion. The method may have a further characterization by which. The method may have a further characterization by which the charge storage layer includes one of a group consisting of discrete storage elements between top and bottom layers of dielectric and a continuous storage element between top and bottom layers of dielectric. The method may have a further characterization by which the protective layer includes photoresist. The method may have a further characterization by which the protective mask includes a nitride layer and an oxide layer. The method may have a further characterization by which the forming the logic device includes forming a high k dielectric over the logic portion, forming a barrier layer over the high k dielectric, and patterning the barrier layer. The method may have a further characterization by which the forming the logic device further includes forming a polysilicon layer over the barrier layer and patterning the polysilicon layer and the high k dielectric, wherein the patterning the polysilicon layer and the high k dielectric is aligned with the patterning the barrier layer to leave a gate stack. The method may have a further characterization by which the fabricating the memory cell further includes depositing a layer of polysilicon for the third conductive layer. The method may have a further characterization by which the second oxide is grown on the first conductive layer in the NVM portion and the logic portion.

Also disclosed is a method of making a semiconductor structure using a substrate having a non-volatile memory (NVM) portion, a first high voltage portion, a second high voltage portion and a logic portion. The method includes forming a first conductive layer over an oxide layer on a major surface of the substrate in the NVM portion, the first and second high voltage portions, and logic portion. The method further includes fabricating a memory cell in the NVM portion while the first conductive layer remains in the first and second high voltage portions and the logic portion. The method further includes patterning the first conductive layer to form transistor gates in the first and second high voltage portions. The method further includes forming a protective mask over the NVM portion and the first and second high voltage portions. The method further includes forming a transistor gate in the logic portion while the protective mask remains in the NVM portion and the first and second high voltage portions. The method may have a further characterization by which the fabricating the memory cell further includes forming a select gate by implanting a portion of the first conductive layer and patterning the first conductive layer, and forming a charge storage layer over the select gate and the substrate in the NVM portion, and in the first and second voltage portions, and the logic portion, depositing a second conductive layer over the charge storage layer in the NVM portion, the first and second high voltage portions, and the logic portion, patterning the second conductive layer and the charge storage layer to form a control gate over a remaining portion of the charge storage layer and a portion of the select gate in the NVM portion, and to remove the charge storage layer and the second conductive layer in the first and second high voltage portions and the logic portion. The method may have a further characterization by which the charge storage layer includes one of a group consisting of discrete storage elements between top and bottom layers of dielectric and a continuous storage element between top and bottom layers of dielectric. The method may have a further characterization by which the patterning the first conductive layer for the fabricating the memory cell and the patterning the first conductive layer to form the transistor gates in the first and second high voltage portions is performed concurrently. The method may have a further characterization by which the fabricating the memory cell includes patterning the first conductive layer to form a gate for the memory cell, and the patterning the first conductive layer to form the transistor gates in the first and second high voltage portions is performed concurrently with the patterning the first conductive layer to form the gate for the memory cell. The method may have a further characterization by which the protective mask includes a nitride layer and an oxide layer. The method may have a further characterization by which the forming the transistor gate includes forming a high k dielectric, forming a barrier layer over the high k dielectric, forming a polysilicon layer over the barrier layer, and patterning the high k dielectric, the barrier layer, and the polysilicon layer. The method may have a further characterization by which the first conductive layer is a layer of polysilicon. The method may have a further characterization by which the fabricating includes using a protective layer over the first and second high voltage portions and the logic portion when performing an implant in a second conductive layer in the NVM portion. The method may further include, before fabricating the memory cell, patterning and etching the first conductive layer to expose the first and second high voltage portions, growing a second oxide in the NVM portion, the first and second high voltage portions, and the logic portion, masking a first of the high voltage portions, etching the second oxide from the NVM portion, a second of the high voltage portions, and the logic portion while the first of the high voltage portions is masked, growing a third oxide in the NVM portion, the first and second high voltage portions, and the logic portion, masking the first and second high voltage portions, etching the third oxide and the first conductive layer in the NVM portion and the logic portion while the first and second high voltage portions remain masked, and growing a fourth oxide in the NVM portion, the first and second high voltage portions, and the logic portion.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different or additional types of active regions may be used such as further levels of high voltage and different well types and corresponding transistor types. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of making a semiconductor structure using a substrate having a non-volatile memory (NVM) portion, a high voltage portion, a medium voltage portion, and a logic portion, comprising:

growing a first oxide on a major surface of the substrate in the NVM portion, the high voltage portion, the medium voltage portion, and logic portion;

depositing a first conductive layer over the first oxide in the NVM portion, the high voltage portion, the medium voltage portion, and the logic portion;

patterning and etching the first conductive layer to expose the high voltage portion and the medium voltage portion;

growing a second oxide in the NVM portion, the high voltage portion, the medium voltage portion, and the logic portion;

masking the high voltage portion;

etching the second oxide from the NVM portion, medium voltage portion, and the logic portion while the high voltage portion is masked;

growing a third oxide in the NVM portion, the high voltage portion, the medium voltage portion, and the logic portion;

masking the high voltage portion and the medium voltage portion;

etching the third oxide and the first conductive layer in the NVM portion and the logic portion while the high voltage portion and the medium voltage portion remain masked;

growing a fourth oxide in the NVM portion, the high voltage portion, the medium voltage portion, and the logic portion;

fabricating a memory cell requiring high voltage during operation in the NVM portion, the fabricating including using a protective layer over the high voltage portion, the medium voltage portion, and the logic portion when performing an implant in a second conductive layer in the NVM portion;

removing the protective layer over the high voltage portion, the medium voltage portion, and the logic portion;

patterning transistor gates in the high voltage portion and the medium voltage portion;

depositing a protective mask in the NVM portion, the high voltage portion, and the medium voltage portion; and forming a logic device in the logic portion while the protective mask remains in the NVM portion, the high voltage portion, and the medium voltage portion.

2. The method of claim 1, wherein the fabricating the memory cell further comprises:

forming a select gate by implanting the second conductive layer and patterning the second conductive layer and the fourth oxide;

forming a charge storage layer over the select gate and the substrate in the NVM portion, and in the high voltage portion, the medium voltage portion, and the logic portion;

depositing a third conductive layer over the charge storage layer in the NVM portion, the high voltage portion, the medium voltage portion, and the logic portion;

patterning the third conductive layer and the charge storage layer to form a control gate over a remaining portion of the charge storage layer and a portion of the select gate in the NVM portion, and to remove the charge storage layer and the third conductive layer in the high voltage portion, the medium voltage portion, and the logic portion.

3. The method of claim 2, wherein the charge storage layer includes one of a group consisting of discrete storage elements between top and bottom layers of dielectric and a continuous storage element between top and bottom layers of dielectric.

4. The method of claim 2, wherein the fabricating the memory cell further comprises:

depositing a layer of polysilicon for the third conductive layer.

5. The method of claim 1, wherein the protective layer includes photoresist.

6. The method of claim 1, wherein the protective mask includes a nitride layer and an oxide layer.

7. The method of claim 1, wherein the forming the logic device comprises:

forming a high k dielectric over the logic portion;

forming a barrier layer over the high k dielectric; and patterning the barrier layer.

8. The method of claim 7, wherein the forming the logic device further comprises:

forming a polysilicon layer over the barrier layer; and patterning the polysilicon layer and the high k dielectric, wherein the patterning the polysilicon layer and the high k dielectric is aligned with the patterning the barrier layer to leave a gate stack.

9. The method of claim 1, wherein the fabricating the memory cell further comprises:

depositing a layer of polysilicon for the second conductive layer.

10. The method of claim 1, wherein the second oxide is grown on the first conductive layer in the NVM portion and the logic portion.

11. A method of making a semiconductor structure using a substrate having a non-volatile memory (NVM) portion, a first high voltage portion, a second high voltage portion and a logic portion, comprising:

forming a first conductive layer over an oxide layer on a major surface of the substrate in the NVM portion, the first and second high voltage portions, and logic portion;

fabricating a memory cell in the NVM portion while the first conductive layer remains in the first and second high voltage portions and the logic portion;

patterning the first conductive layer to form transistor gates in the first and second high voltage portions;

forming a protective mask over the NVM portion and the first and second high voltage portions; and forming a transistor gate in the logic portion while the protective mask remains in the NVM portion and the first and second high voltage portions.

12. The method of claim 11, wherein the fabricating the memory cell further comprises:

forming a select gate by implanting a portion of the first conductive layer and patterning the first conductive layer;

forming a charge storage layer over the select gate and the substrate in the NVM portion, and in the first and second voltage portions, and the logic portion;

depositing a second conductive layer over the charge storage layer in the NVM portion, the first and second high voltage portions, and the logic portion;

patterning the second conductive layer and the charge storage layer to form a control gate over a remaining portion of the charge storage layer and a portion of the select gate in the NVM portion, and to remove the charge storage layer and the second conductive layer in the first and second high voltage portions and the logic portion.

13. The method of claim 12, wherein the charge storage layer includes one of a group consisting of discrete storage elements between top and bottom layers of dielectric and a continuous storage element between top and bottom layers of dielectric.

14. The method of claim 12, wherein the patterning the first conductive layer for the fabricating the memory cell and the patterning the first conductive layer to form the transistor gates in the first and second high voltage portions is performed concurrently.

15. The method of claim 11, wherein the fabricating the memory cell includes patterning the first conductive layer to form a gate for the memory cell, and the patterning the first conductive layer to form the transistor gates in the first and second high voltage portions is performed concurrently with the patterning the first conductive layer to form the gate for the memory cell.

16. The method of claim 11, wherein the protective mask includes a nitride layer and an oxide layer.

17. The method of claim 11, wherein the forming the transistor gate comprises:
forming a high k dielectric;
forming a barrier layer over the high k dielectric;
forming a polysilicon layer over the barrier layer; and
patterning the high k dielectric, the barrier layer, and the polysilicon layer.

18. The method of claim 11, wherein:
the first conductive layer is a layer of polysilicon.

19. The method of claim 11, wherein:
the fabricating includes using a protective layer over the first and second high voltage portions and the logic portion when performing an implant in a second conductive layer in the NVM portion.

20. The method of claim 11, further comprising:
before fabricating the memory cell:
  patterning and etching the first conductive layer to expose the first and second high voltage portions;
  growing a second oxide in the NVM portion, the first and second high voltage portions, and the logic portion;
  masking a first of the high voltage portions;
  etching the second oxide from the NVM portion, a second of the high voltage portions, and the logic portion while the first of the high voltage portions is masked;
  growing a third oxide in the NVM portion, the first and second high voltage portions, and the logic portion;
  masking the first and second high voltage portions;
  etching the third oxide and the first conductive layer in the NVM portion and the logic portion while the first and second high voltage portions remain masked; and
  growing a fourth oxide in the NVM portion, the first and second high voltage portions, and the logic portion.

* * * * *